United States Patent
Dan

(10) Patent No.: US 11,543,748 B2
(45) Date of Patent: Jan. 3, 2023

(54) THIN FILM CIRCUIT SUBSTRATE AND MANUFACTURING METHOD THEREOF

(71) Applicant: AMOGREENTECH CO., LTD., Gimpo-si (KR)

(72) Inventor: Sung-Baek Dan, Hwaseong-si (KR)

(73) Assignee: AMOGREENTECH CO., LTD., Gyeonggi-Do (KR)

( * ) Notice: Subject to any disclaimer, the term of this patent is extended or adjusted under 35 U.S.C. 154(b) by 346 days.

(21) Appl. No.: 16/646,905

(22) PCT Filed: Sep. 13, 2018

(86) PCT No.: PCT/KR2018/010778
§ 371 (c)(1),
(2) Date: Mar. 12, 2020

(87) PCT Pub. No.: WO2019/054781
PCT Pub. Date: Mar. 21, 2019

(65) Prior Publication Data
US 2020/0301279 A1      Sep. 24, 2020

(30) Foreign Application Priority Data

Sep. 18, 2017 (KR) .................. 10-2017-0119789

(51) Int. Cl.
| G03F 7/004 | (2006.01) |
| H05K 1/09 | (2006.01) |
| H05K 3/06 | (2006.01) |
| G03F 7/16 | (2006.01) |

(Continued)

(52) U.S. Cl.
CPC .............. *G03F 7/004* (2013.01); *G03F 7/164* (2013.01); *H05K 1/0393* (2013.01); *H05K 1/09* (2013.01); *H05K 3/022* (2013.01); *H05K 3/064* (2013.01)

(58) Field of Classification Search
CPC ........................ H05K 3/064; H05K 1/0393
See application file for complete search history.

(56) References Cited

U.S. PATENT DOCUMENTS

| 2006/0016553 A1 | 1/2006 | Watanabe |
| 2008/0239684 A1* | 10/2008 | Yamasaki .............. H05K 3/388 29/850 |
| 2010/0243601 A1 | 9/2010 | Uematsu et al. |

(Continued)

FOREIGN PATENT DOCUMENTS

| JP | 2010232418 A | 10/2010 |
| KR | 20060043282 A | 5/2006 |

(Continued)

*Primary Examiner* — Farun Lu
(74) *Attorney, Agent, or Firm* — CL Intellectual LLC

(57) ABSTRACT

Disclosed is a thin film circuit substrate and a manufacturing method thereof, which are capable of forming a pattern having a feature size of less than 10 μm by forming a seed layer and a plating layer on a base substrate and then forming, through electrospinning, a photoresist layer having a thickness in a set range. The disclosed thin film circuit substrate comprises: a base substrate; a thin film seed layer formed on the top surface of the base substrate; a metal layer formed on the top surface of the thin film seed layer; and a photoresist layer formed on the top surface of the metal layer, wherein the thickness of the photoresist layer is in a range of 1 μm to 5 μm.

6 Claims, 3 Drawing Sheets

(51) Int. Cl.
*H05K 1/03* (2006.01)
*H05K 3/02* (2006.01)

(56) References Cited

U.S. PATENT DOCUMENTS

2010/0288539 A1 11/2010 Washima
2016/0270242 A1* 9/2016 Kim .................... H05K 1/0353

FOREIGN PATENT DOCUMENTS

| KR | 2007-0106173 A | 11/2007 |
| KR | 2008-0090285 A | 10/2008 |
| KR | 10-2009-0071494 A | 7/2009 |
| KR | 2009-0100021 A | 9/2009 |
| KR | 2010-0100008 A | 9/2010 |
| KR | 2016-0046774 A | 4/2016 |

* cited by examiner

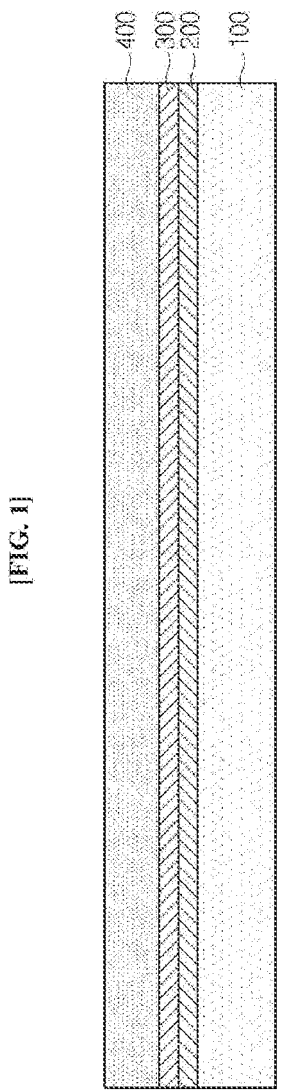

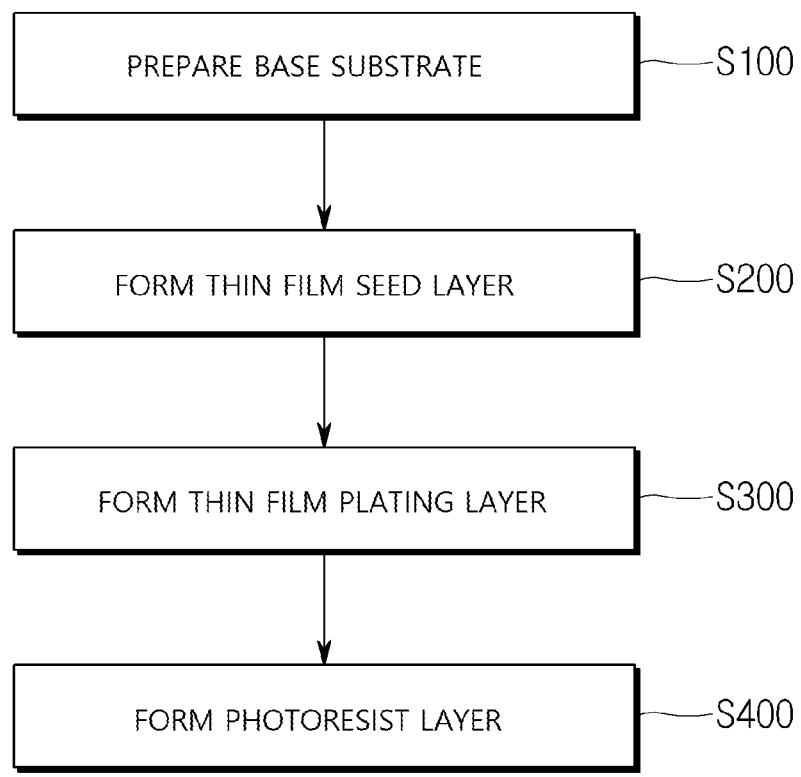
[FIG. 2]

[FIG. 3]
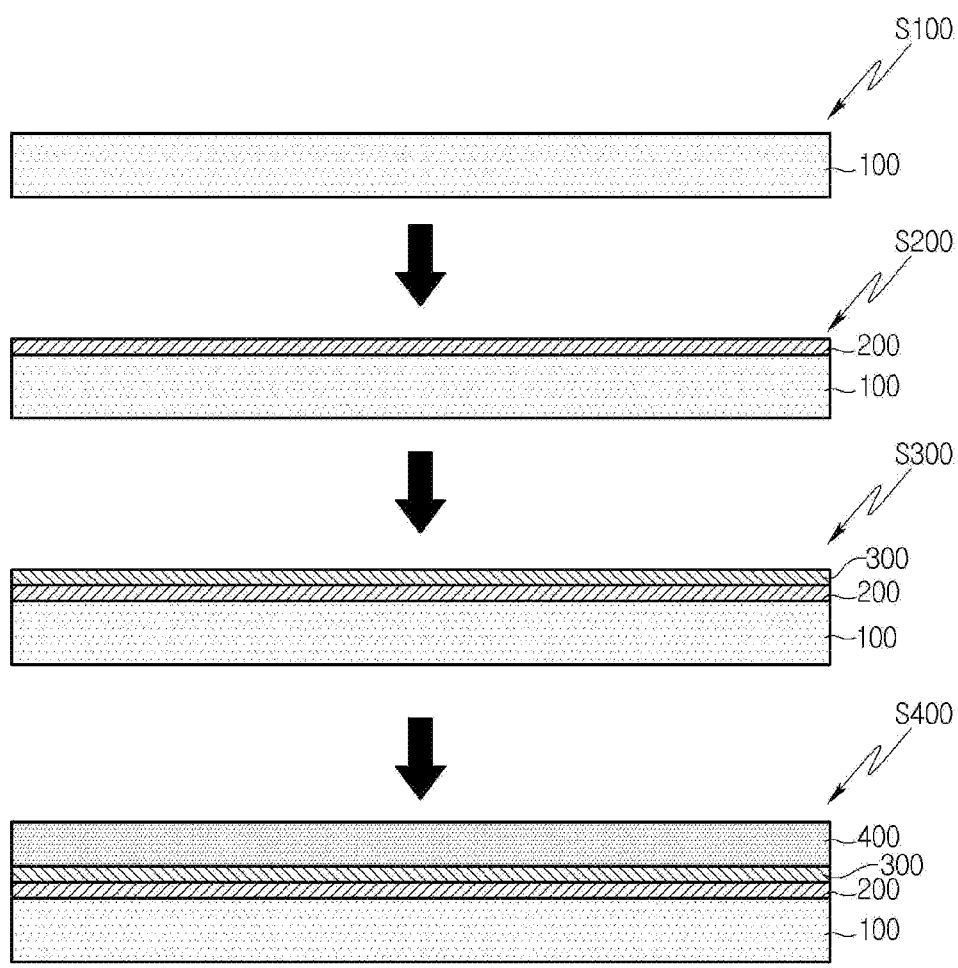

THIN FILM CIRCUIT SUBSTRATE AND MANUFACTURING METHOD THEREOF

CROSS-REFERENCE TO RELATED APPLICATIONS

This application is a National Stage of International patent application PCT/KR2018/010778, filed on Sep. 13, 2018, which claims priority to foreign Korean patent application No. KR 10-2017-0119789, filed on Sep. 18, 2017, the disclosures of which are incorporated by reference in their entirety.

FIELD OF THE INVENTION

The present disclosure relates to a thin film circuit substrate and a manufacturing method thereof, and more particularly, to a thin film circuit substrate used for manufacturing a film of a Chip On Film (COF) requiring a fine circuit pattern and a manufacturing method thereof.

BACKGROUND

A Chip On Film (COF) is a method of mounting a semiconductor chip on a thin film-shaped printed circuit substrate (PCB). The COF may form a pattern having a thinner line width as compared to a Tape Carrier Package (TCP).

Recently, the demand for the COF capable of a fine pattern is rapidly increasing according to the trend of the light, thin, short, and small form of a portable terminal. The thin film circuit substrate (or thin film) for the COF may form the pattern having the line width of about 10 μm.

However, with the lighter, thinner, shorter, and smaller trend of the portable terminal, a pattern having a thinner line width is required.

According to the market demand, the COF manufacturing industry is conducting research on the thin film circuit substrate for the COF that may form the pattern having the line width of less than 10 mm.

SUMMARY OF THE INVENTION

The present disclosure is proposed in consideration of the above circumstances, and an object of the present disclosure is to provide a thin film circuit substrate and a manufacturing method thereof, which may form a seed layer and a plating layer on a base substrate and then form a photoresist layer having a thickness of a set range through electrospinning, thereby forming a pattern having the line width of less than 10 μm.

For achieving the object, a thin film circuit substrate according to an embodiment of the present disclosure includes a base substrate, a thin film seed layer formed on the top surface of the base substrate, a metal layer formed on the top surface of the thin film seed layer, and a photoresist layer formed on the top surface of the metal layer, and the thickness of the photoresist layer is in a range of 1 μm to 5 μm.

For achieving the object, a method of manufacturing a thin film circuit substrate according to an embodiment of the present disclosure includes preparing a base substrate, forming a thin film seed layer on the top surface of the base substrate, forming a plating layer on the top surface of the thin film seed layer, and forming a photoresist layer on the top surface of the plating layer, and the forming of the photoresist layer forms the photoresist layer by electrospinning a photosensitizer on the top surface of the plating layer, and the thickness of the photoresist layer is in a range of 1 μm to 5 μm.

According to the present disclosure, the thin film circuit substrate and the manufacturing method thereof may form the photoresist layer through the electrospinning, thereby forming the thickness of the photoresist layer in a range of 1 μm to 5 μm.

In addition, the thin film circuit substrate and the manufacturing method thereof may form the seed layer and the plating layer on the base substrate and then form the photoresist layer having the thickness of the set range through the electrospinning, thereby forming the fine pattern having the line width of less than 10 μm required for the COF.

BRIEF DESCRIPTION OF THE DRAWINGS

FIG. 1 is a diagram for explaining a thin film circuit substrate according to an embodiment of the present disclosure.

FIGS. 2 and 3 are diagrams for explaining a method of manufacturing a thin film circuit substrate according to an embodiment of the present disclosure.

DETAILED DESCRIPTION

Hereinafter, the most preferred embodiment of the present disclosure will be described with reference to the accompanying drawings in order to specifically describe so that those skilled in the art to which the present disclosure pertains may easily practice the technical spirit of the present disclosure. First, in adding reference numerals to the components of each drawing, it should be noted that the same components are denoted by the same reference numerals as much as possible even if displayed on different drawings. In addition, in describing the present disclosure, when it is determined that the detailed description of the related known configuration or function may obscure the gist of the present disclosure, the detailed description thereof will be omitted.

Referring to FIG. 1, a thin film circuit substrate according to an embodiment of the present disclosure includes a base substrate 100, a thin film seed layer 200, a thin film plating layer 300, and a photoresist layer 400.

The base substrate 100 is composed of a plate-shaped substrate or film of a flexible material. The base substrate 100 is, for example, a polyimide (PI) film.

The thin film seed layer 200 is disposed on the surface of the base substrate 100. The thin film seed layer 200 is disposed on at least one surface of the top surface and the bottom surface of the base substrate 100.

The thin film seed layer 200 is formed on the surface of the base substrate 100 through a sputtering process. The thin film seed layer 200 includes, for example, at least one of nickel (Ni) and copper (Cu).

The thin film plating layer 300 is disposed on the surface of the thin film seed layer 200. The thin film seed layer 200 is disposed on the top surface of the thin film seed layer 200 formed on the top surface of the base substrate 100. The thin film seed layer 200 may also be disposed on the bottom surface of the thin film seed layer 200 formed on the bottom surface of the base substrate 100.

The thin film plating layer 300 is formed on the surface of the thin film seed layer 200 through an electroplating process. The thin film plating layer 300 is, for example, copper (Cu).

The thickness obtained by summing the thickness of the base substrate 100, the thickness of the thin film seed layer 200, and the thickness of the thin film plating layer 300 is, for example, about 5 μm or less. The thickness of the base substrate 100, the thickness of the thin film seed layer 200, and the thickness of the thin film plating layer 300 may be formed differently based on the intended use.

The photoresist layer 400 is disposed on the surface of the thin film plating layer 300. The photoresist layer 400 is formed on the top surface of the thin film plating layer 300 disposed on the top surface of the base substrate 100. The photoresist layer 400 may also be formed on the bottom surface of the thin film plating layer 300 disposed on the bottom surface of the base substrate 100.

The photoresist layer 400 is formed on the surface of the thin film plating layer 300 through the electrospinning process. The photoresist layer 400 is formed by electrospinning a photosensitizer (that is, a photoresist liquid, a photosensitive polymer solution) on the surface of the thin film plating layer 300.

The photoresist layer 400 is formed to a thickness within a set thickness range. The thickness of the photoresist layer 400 is 1 μm or more, which is the minimum value of the set thickness range, and 5 μm or less, which is the maximum value of the set thickness range, for example.

When the photoresist layer 400 is formed to a thickness of less than 1 μm through the electrospinning process, the thickness and the surface thereof become uneven. When the photoresist layer 400 is formed to a thickness of more than 5 μm, the electrospinning process is needed to repeat several times in the case of performing the electrospinning, thereby rapidly increasing the manufacturing costs.

Accordingly, the photoresist layer 400 is formed to a thickness of a range of 1 μm to 5 μm, which is the set thickness range.

Since the photoresist layer 400 is quickly dried, the thinner volatilization is advantageous and the price competitiveness is advantageous as the photoresist layer 400 is thinner. Accordingly, the photoresist layer 400 is formed to a thickness as thin as possible within the set thickness range.

Referring to FIGS. 2 and 3, a method of manufacturing the thin film circuit substrate according to an embodiment of the present disclosure includes preparing a base substrate (S100), forming a thin film seed layer (S200), forming a thin film plating layer (S300), and forming a photoresist layer (S400).

The preparing of the base substrate (S100) prepares the base substrate 100 having a plate-shaped substrate or film of a flexible material. The base substrate 100 is, for example, a polyimide (PI) film.

The forming of the thin film seed layer (S200) forms the thin film seed layer 200 on the surface of the base substrate 100. The thin film seed layer 200 is formed on at least one surface of the top surface and the bottom surface of the base substrate 100.

The forming of the thin film seed layer (S200) forms the thin film seed layer 200 through a sputtering process. The thin film seed layer 200 is, for example, made of a material including at least one of nickel (Ni) and copper (Cu).

The forming of the thin film plating layer (S300) forms the thin film plating layer 300 on the surface of the thin film seed layer 200. The forming of the thin film plating layer (S300) forms the thin film plating layer 300 on the top surface of the thin film seed layer 200 formed on the top surface of the base substrate 100. The forming of the thin film plating layer (S300) may also form the thin film plating layer 300 on the bottom surface of the thin film seed layer 200 formed on the bottom surface of the base substrate 100.

The forming of the thin film plating layer (S300) forms the thin film plating layer 300 on the surface of the thin film seed layer 200 through an electroplating process. The thin film plating layer 300 is, for example, copper (Cu).

In the method of manufacturing the thin film circuit substrate, the thickness obtained by summing the thickness of the base substrate 100, the thickness of the thin film seed layer 200, and the thickness of the thin film plating layer 300 is, for example, about 5 μm or less. The thickness of the base substrate 100, the thickness of the thin film seed layer 200, and the thickness of the thin film plating layer 300 may be formed differently based on the intended use.

The forming of the photoresist layer (S400) forms the photoresist layer 400 on the surface of the thin film plating layer 300. The forming of the photoresist layer (S400) forms the photoresist layer 400 on the top surface of the thin film plating layer 300 disposed on the top surface of the base substrate 100. The forming of the photoresist layer (S400) may also form the photoresist layer 400 on the bottom surface of the thin film plating layer 300 disposed on the bottom surface of the base substrate 100.

The forming of the photoresist layer (S400) forms the photoresist layer 400 on the surface of the thin film plating layer 300 through the electrospinning process. The forming of the photoresist layer (S400) forms the photoresist layer 400 having a set thickness on the surface of the thin film plating layer 300 by electrospinning a photosensitizer (that is, a photoresist liquid and a photosensitive polymer solution).

In the forming of the photoresist layer (S400), when electrospinning the photoresist layer 400 to the thickness of less than 1 μm, the thickness and the surface thereof are unevenly formed. In the forming of the photoresist layer (S400), the electrospinning is needed to repeat several times in the case of performing the electrospinning to a thickness of more than 5 μm, thereby rapidly increasing the manufacturing costs.

Accordingly, the forming of the photoresist layer (S400) forms the photoresist layer 400 having the thickness of a range of 1 μm to 5 μm.

While the preferred embodiment according to the present disclosure has been described above, modifications may be made in various forms, and it is understood that those skilled in the art will be able to practice various changes and modifications without departing from the claims of the present disclosure.

The invention claimed is:

1. A thin film circuit substrate comprising:
   a base substrate;
   a thin film seed layer formed on a top surface of the base substrate;
   a metal layer formed on a top surface of the thin film seed layer; and
   a photoresist layer formed by electrospinning a photosensitizer on a top surface of the metal layer,
   wherein a thickness of the photoresist layer is in a range of 1 μm to 5 μm,and
   wherein a sum of thickness of the base substitute, a thickness of the thin film seed layer and a thickness of the metal layer is not greater than 5 μm.

2. The thin film circuit substrate of claim 1, wherein the thin film seed layer comprises at least one of nickel (Ni) and copper (Cu).

3. The thin film circuit substrate of claim 1, wherein the metal layer comprises copper (Cu).

4. A method of manufacturing a thin film circuit substrate, the method comprising:
  preparing a base substrate;
  forming a thin film seed layer on a top surface of the base substrate;
  forming a plating layer on a top surface of the thin film seed layer; and
  forming a photoresist layer on a top surface of the plating layer,
  wherein the forming of a photoresist layer forms the photoresist layer by electrospinning a photosensitizer on the top surface of the plating layer, and a thickness of the photoresist layer is in a range of 1 μm to 5 μm, and
  wherein a sum of thickness of the base substrate, a thickness of the thin film seed layer and a thickness of the plating layer is not greater than 5 um.

5. The method of claim 4, wherein the forming of the thin film seed layer forms the thin film seed layer through a sputtering process, and the thin film seed layer comprises at least one of nickel (Ni) and copper (Cu).

6. The method of claim 4, wherein the forming of the plating layer forms the plating layer on the surface of the thin film seed layer through an electroplating process, and the plating layer comprises copper (Cu).

* * * * *